United States Patent
Weinfurtner

[19]

[11] Patent Number: 5,933,374
[45] Date of Patent: Aug. 3, 1999

[54] MEMORY WITH REDUCED WIRE CONNECTIONS

[75] Inventor: Oliver Weinfurtner, Fishkill, N.Y.

[73] Assignee: Siemens Aktiengesellschaft, Munich, Germany

[21] Appl. No.: 09/097,545

[22] Filed: Jun. 15, 1998

[51] Int. Cl.[6] .................................................. G11C 16/04
[52] U.S. Cl. ................ 365/189.09; 365/219; 365/189.12
[58] Field of Search .............................. 365/189.09, 219, 365/189.12, 201, 226

[56] References Cited

U.S. PATENT DOCUMENTS

| 5,214,605 | 5/1993 | Lim et al. ....................... 365/189.09 X |
| 5,790,454 | 8/1998 | Choi ................................ 365/189.12 X |

Primary Examiner—Huan Hoang
Attorney, Agent, or Firm—Stanton C. Braden

[57] ABSTRACT

In memory systems embodying the invention a controller/sequencer circuit converts a multiplicity of control signals into a serial stream of control signals which are carried from the controller/sequencer circuit via a single ("data") line to the data input of a control path (e.g., a multi-stage shift register) which is disposed in proximity to a functions generator (e.g., a voltages generator). After the control path is serially loaded with a selected number of control signals, the control signals are selectively applied, in parallel, to the functions generator. Where the control path is a shift register, three control lines are routed from the controller/sequencer to the shift register. One line carries the serial control signals to the input of the shift register; one line (i.e., a shift line) carries shift signals for causing the transfer of the control signals along the shift register stages; and one line (i.e., a select line) is used to selectively transfer control signals accumulated in the shift register to the voltages generator.

21 Claims, 7 Drawing Sheets

MEMORY WITH REDUCED WIRE CONNECTIONS

BACKGROUND OF THE INVENTION

This invention relates to memory systems and, in particular, to semiconductor memories in which the wire connections needed to control and/or test selected functions are reduced.

A problem solved by the present invention is best explained with reference to the prior art scheme shown in FIG. 1. FIG. 1 shows a portion of a dynamic random access memory (DRAM), 10, formed on a single integrated circuit (IC) or chip. The DRAM 10 includes a voltages generator block 12 which under the control of a controller 14 is used to generate many of the different voltages (e.g., operating, bias and reference voltages) needed to operate various circuits on the chip. As outlined in FIGS. 1 and 2, the voltages generator block 12 is supplied with: (a) an external input voltage (Vext) which is distributed to various sub-circuits; (b) "x" test and configuration control signals; (c) "y" static enables control signals; and (d) "z" dynamic enable control signals; where each one of x, y and z may be a different valued integer equal to or greater than one. In response to the application of Vext and the various x, y and z signals, the voltages generator block 12 produces a multiplicity of output voltages (e.g., V1 through Vm) for distribution to, and within, the memory system, and also controls the complex power-on sequence of the voltages generating system. Accordingly, the voltages generator block 12 functions as the basic voltages generator for the DRAM system.

The generated voltages may include reference voltages (e.g., for input/output receivers and bias current and voltage generation in analog circuits) as well as several voltages for supplying different functional blocks of the DRAM with different operating voltages (e.g., VBLH to sense amplifiers or VPP to word line drivers).

In FIG. 1, the controller 14 is supplied with signals from fuses, bond pads and a test mode register and clock signals from an oscillator 18. In addition, the controller is coupled to a voltage detector 19, which is used to sense the presence and/or level of certain of the operating and control voltages. The controller 14 is coupled via "x" wire connections (e.g., w1 through wx) and via "y" wire connections to the voltages generator 12. The "x" wire connections serve to carry configuration and test signals and the "y" wire connections serve to carry static enable signals from the controller 14 to the voltages generator 12. Some of these signals are used to manage the complex power on sequence of the generator system and several test and burn-in modes. Some of the configuration signals supplied to the voltages generator 12 function to adjust some of the output voltages to set up a specified addressing mode or a refresh mode of the memory. Other configuration signals may be used to trim oscillators located in the generator block 12 and/or in other sections of the DRAM. Test mode signals may be used to control the function of selected circuits in the voltages generator block 12 or the functionality of other circuits of the DRAM. In addition, a number of dynamic enable signals are coupled from various memory circuits to the voltages controller.

Thus, numerous wire connections are needed to couple the various test and configuration signals to the voltages generator 12 in order to produce the various configurations and to carry out various tests and functions. In accordance with the prior art, a large number (e.g., N, where N is an integer greater than one) of control lines are coupled between a controller and a voltages generator block to carry a large number (e.g., N) of control signals between the controller and the voltages generator. These control lines have to be routed about the chip. The lines and the spacing between the lines takes up much valuable chip space. This creates a problem because the available space and, in particular, the wiring space is very limited. Hence, due to the limited wiring space, the number of test modes and configurations that can be implemented is limited. This results in severe constraints and problems which are significantly reduced in memory systems embodying the invention.

SUMMARY OF THE INVENTION

In contrast to the prior art where a multiplicity of control signals generated by a controller are supplied via a multiplicity of control lines to a functions generator, in memory systems embodying the invention the multiple control signals are converted into a serial stream of control signals which are carried from a controller/sequencer circuit via a single ("data") line to the data input of a control path (e.g., a multi-stage shift register) which is disposed in proximity to the functions generator. After the control path is serially loaded with a selected number of control signals, the control signals are selectively applied, in parallel, to the functions generator.

In a memory circuit embodying the invention the functions generator is a voltages generator for generating and distributing various output voltages to the memory system and the control path is a multi-stage shift register. Three control lines are routed from the controller/sequencer to the shift register. One line carries the serial data (control signals) to the input of the shift register; one line (i.e., a shift line) carries shift signals for causing the transfer of the control signals along the shift register stages; and one line (i.e., a select line) is used to selectively transfer control signals accumulated in the shift register to the voltages generator.

Thus, in a memory system embodying the invention, a shift register chain, which is operated by means of three control lines (i.e., a data line, a shift line and a select line), can supply N control signals to a voltages generator for causing the voltages generator to produce a multiplicity of different output voltages for use in the memory system; where N is an integer greater than one.

In one embodiment of the invention, the three control lines are coupled between a controller and the shift register, with control signals being multiplexed, under the control of the controller, onto a data line coupled to the data input of the shift register, with shift signals being supplied by the controller onto the shift line for synchronously advancing the control signals from stage to stage along the shift register, and with select signals being supplied by the controller onto the select line for selectively transferring the control signals to the voltages generator.

A shift register for use in the invention may include a plurality of stages, with each stage including: (a) a register cell having a data input port, a data output port, and a shift input port for the application thereto of a shift signal for transferring the signal at the register cell's data input port to the register cell's data output port; and (b) a gating cell having first and second data inputs, a select input and a control output, and wherein for one condition of the select input the first data input of a cell is coupled to the control output of the cell and for another condition of the select input the second data input of the cell is coupled to the control output of the cell.

In memory systems embodying the invention selected ones of the control outputs of the shift register are coupled to the voltages generator. In one embodiment of the invention, a selected control output of a shift register stage is coupled to the select input of another stage.

The structure of the shift register stages allows for different arrangements and the passage of different signals. In one embodiment the first data input of each gating cell of each shift register stage is connected to the control output port of its stage. The second data input of a selected gating cell may be connected to a predetermined voltage point. Alternatively, the second data input of a selected gating cell may be connected to a control point derived from the controller.

The invention is illustrated using a shift register, but it should be understood that any suitable control path performing a similar function could be used instead.

BRIEF DESCRIPTION OF THE DRAWINGS

In the accompanying figures like reference characters denote like components.

DETAILED DESCRIPTION OF THE INVENTION

Figure 3:
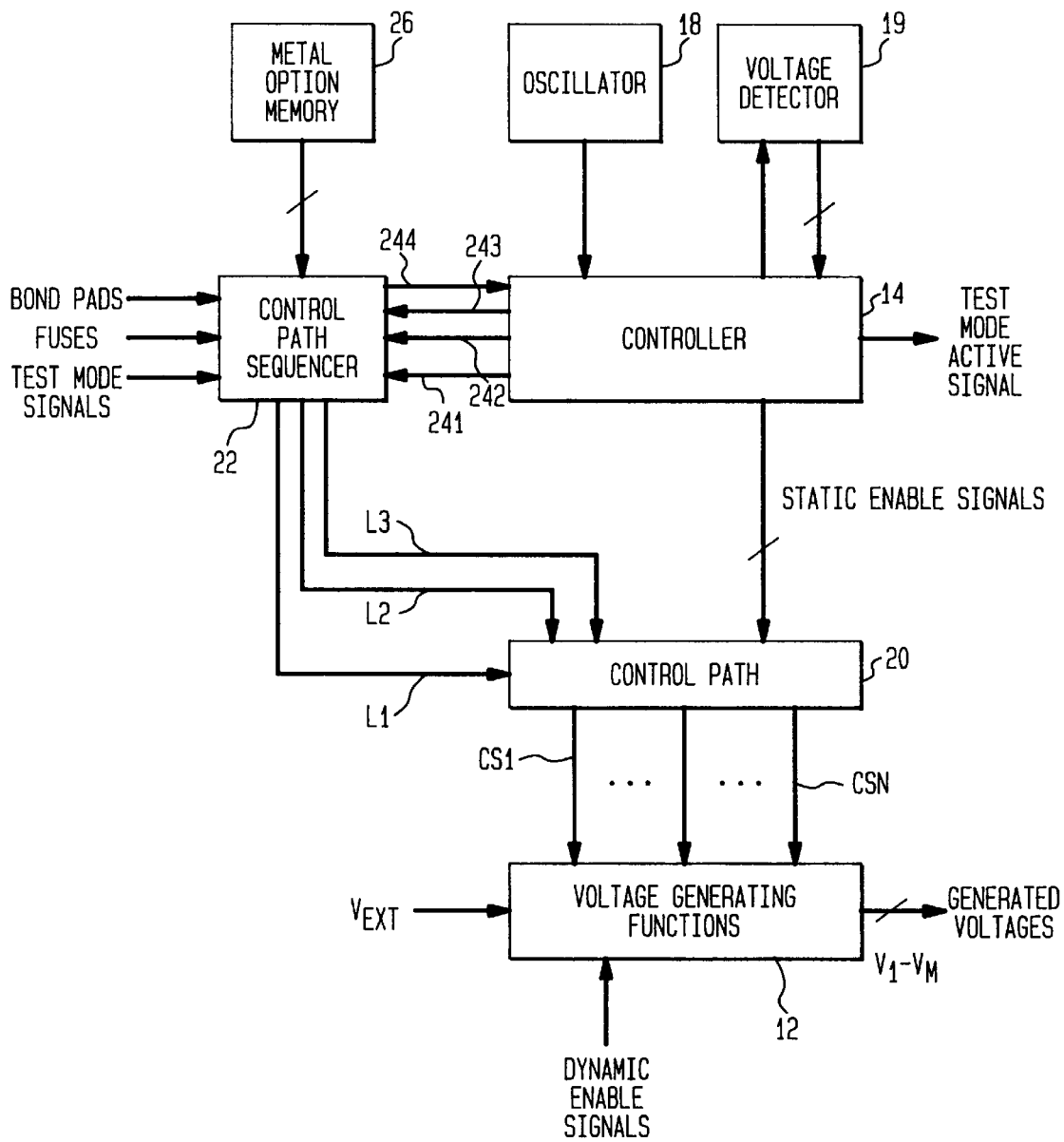
FIG. 3 is a simplified block diagram of a memory system embodying the invention.

FIG. 3 shows a block diagram of a memory system embodying the invention. The voltages generator 12 is supplied with an external voltage (Vext) as in the prior art and produces a multiplicity of output voltages (V1 through Vm), as in the prior art. However, in FIG. 3 the generation of the voltages is primarily controlled by selected control signals (CS1 through CSn) produced by control path circuit 20 and a control path sequencer 22, as further described below. The control path sequencer 22 is coupled to the controller 14 via several lines (e.g., 241, 242, 243, 244) as further detailed in FIG. 7. Timing for controller 14 is determined by an oscillator 18, as in the prior art. Also a voltage detector 19 is coupled to the controller 14 as in the prior art. A metal option memory circuit 26 is coupled to the control path sequencer 22 for controlling and/or varying certain control path sequencer interconnections. Signals from fuses, bond pads and test mode signals are coupled to the control path sequencer and/or controller 14.

Figure 1:
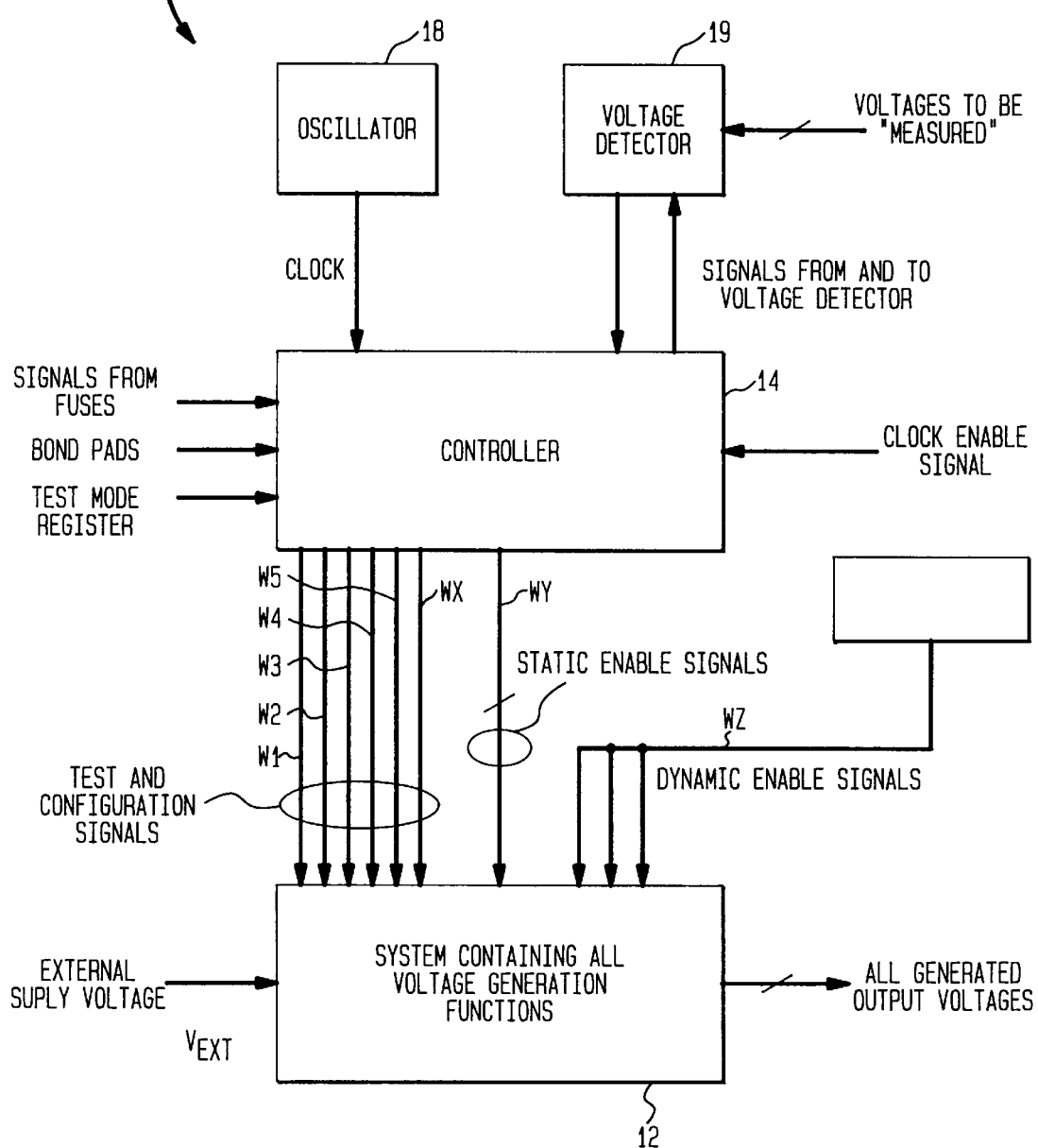
FIG. 1 is a simplified block diagram of a prior art memory system.
Figure 2:
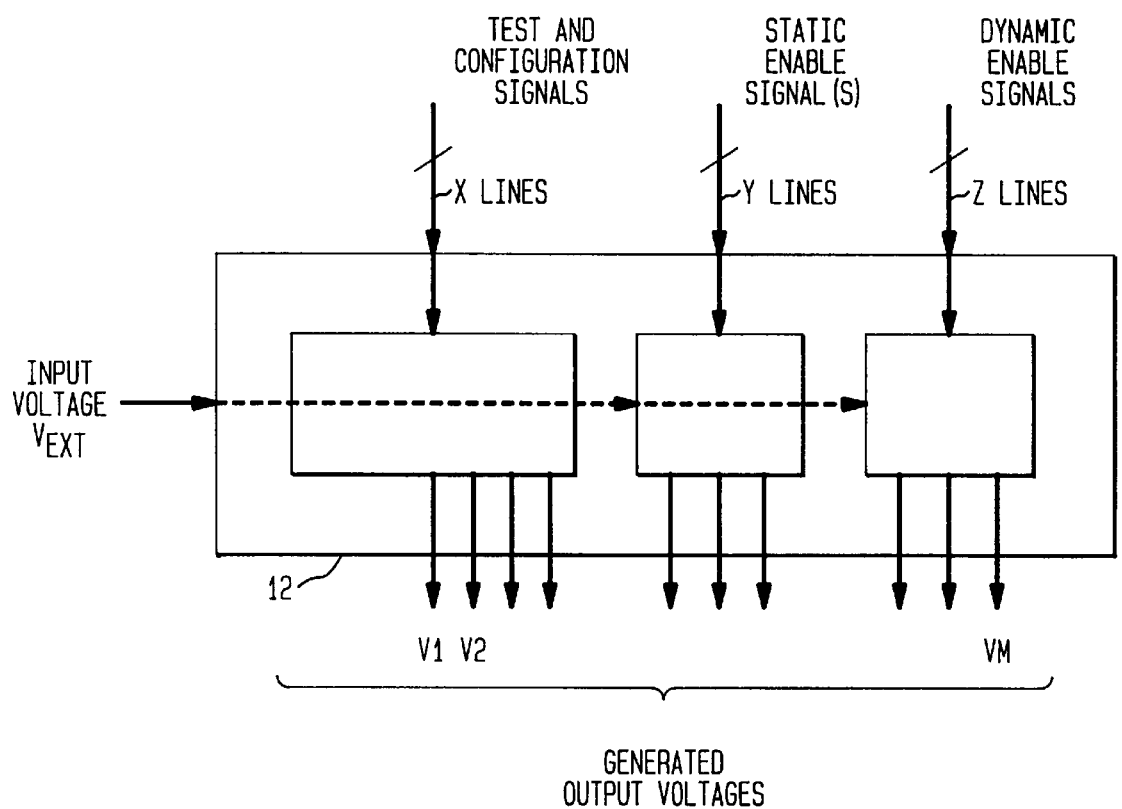
FIG. 2 is a block diagram of a prior art voltages generator block.

In the system of FIG. 3, three lines (L1, L2, L3) are connected between the control sequencer 22 and control path 20. Line L1 is connected to the data input (Din) of the control path 20. For purpose of illustration, assume that all the configuration and test signals (carried by lines w1 through wx) in FIG. 1 are multiplexed under the control of controller 14 and sequencer 22 onto the single "data" line L1. Line L2 connected between sequencer 22 and the control path 20 carries the shift signals derived from controller 14. Line L3 connected between sequencer 22 and control path 20 carries select control signals derived from the controller.

Figure 4A:
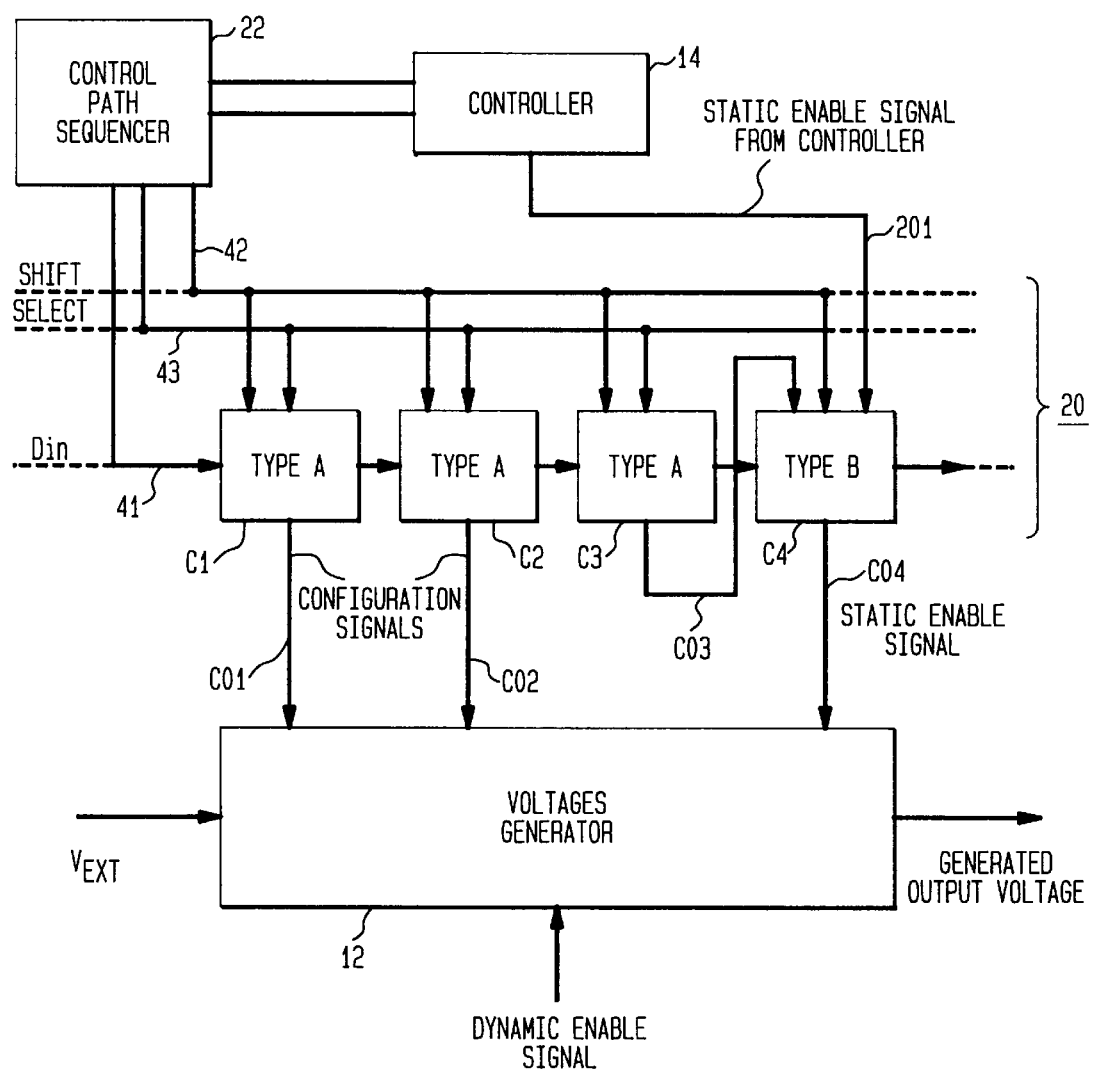
FIGS. 4A and 4B are more detailed block diagrams of a control system according to the invention.
Figure 4B:
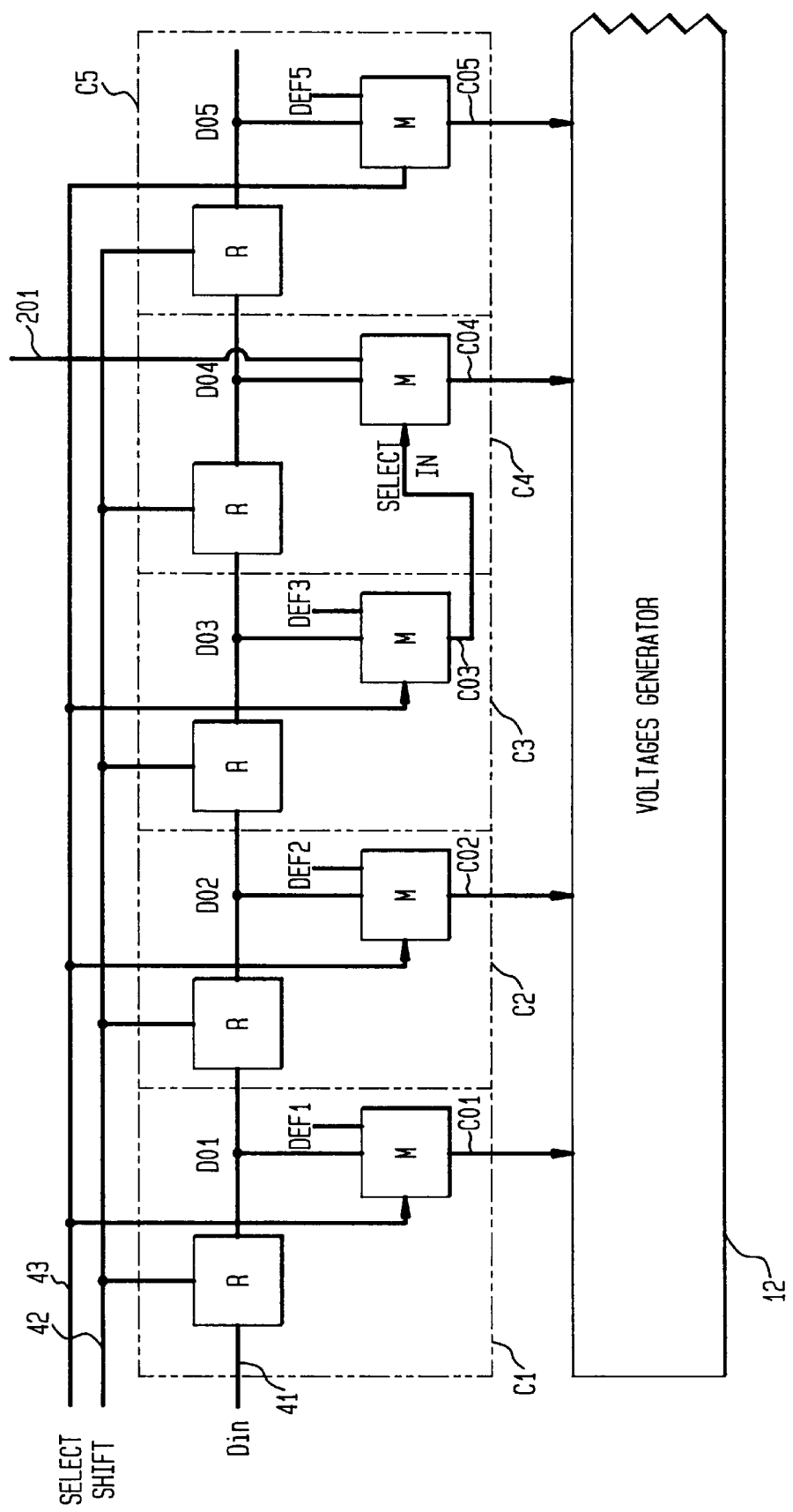
Figure 5:
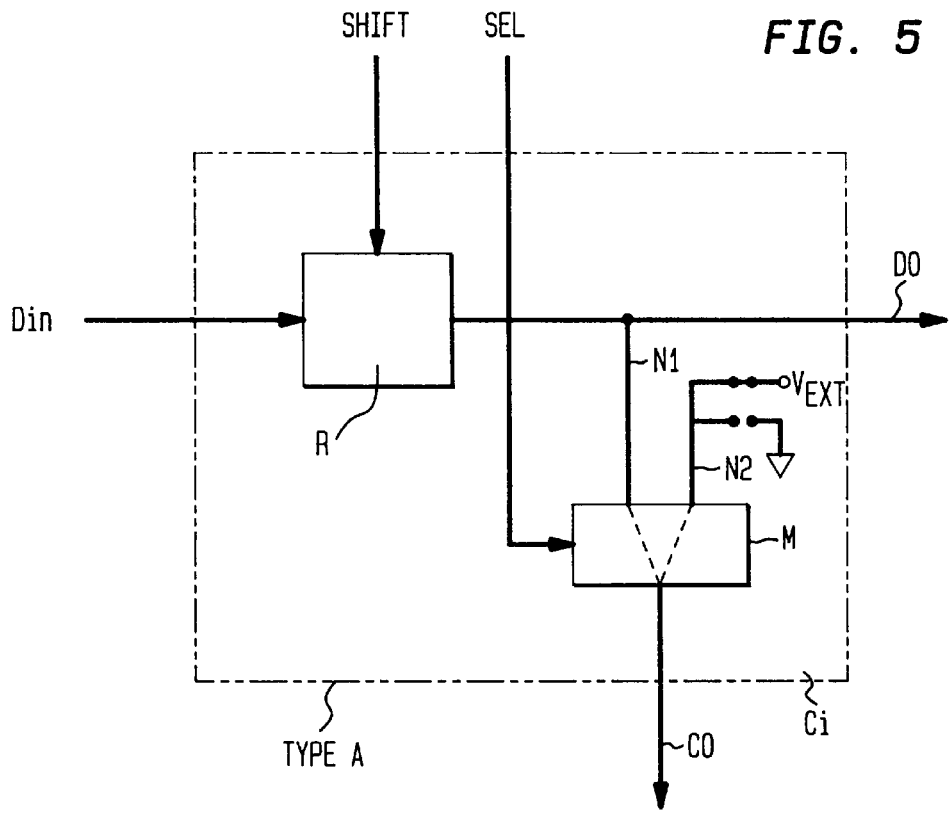
FIG. 5 is a block diagram of a shift register cell suitable for use in practicing the invention.
Figure 6:
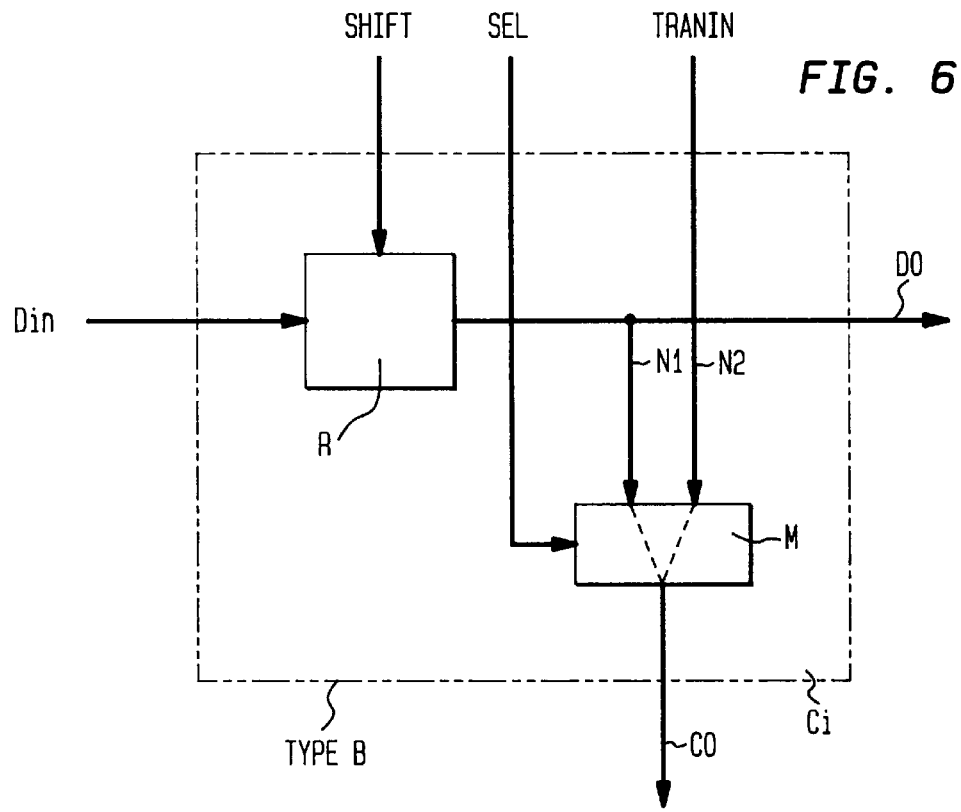
FIG. 6 is a block diagram of another shift register cell suitable for use in practicing the invention.

The control path 20 may be a shift register as shown in FIGS. 4A and 4B. The shift register 20 may be comprised of type A cells of the type shown in FIG. 5 and/or type B cells of the type shown in FIG. 6. For purpose of illustration and explanation, each one of the type A and type B cells is shown to include a one-bit storage register (Ri) and a multiplexing gate (Mi) as shown in FIGS. 5 and 6. The storage register (Ri) of each one of the type A and type B cells includes a data input port (Din), a data output port (Do), and a shift signal input port (SHIFT). Each one of the multiplexing gate (Mi) has a first data input node (N1) and a second data input node (N2), a select input control node (SEL) and an output control signal terminal signal (CO).

The data output port (Do) of each cell (type A or type B) is connected to the first input node (N1) of its multiplexing gate. The second input node (N2) of the type-A gates is connected to a fixed potential (which may be denoted as a default voltage—"DEF"). The default or fixed potential may be ground or Vdd or some other suitable voltage. The second input node (N2) of the type-B cells is coupled to a signal terminal to which is applied a voltage (e.g., TRANIN) derived from the controller 14 or some other suitable signal source.

The passage of a signal from the input port (Din) of a cell to its output port (Do) is controlled by the SHIFT signal. When the SHIFT signal makes a transition from low to high to low (or high to low to high, depending on the internal realization of the circuit) the information at the input port (Din) is stored in the one-bit register (Ri) and appears at the output port (Do) of the register, which is also the cell output. The select input control signal (SEL) controls transmission through the multiplexing gate (Mi). By way of example, if SEL is high then the signal (i.e., Do) at the gate's first input node (N1) is passed to the control output (CO) terminal. If SEL is low, then the signal (DEF or TRANIN) at the gate's second input node (N2) is passed to the control output (CO) terminal. For the type-A cell, a default value which can be high (Vdd) or low (ground) or some other suitable voltage is passed to the control output (CO) terminal, as shown in FIG. 5. For the type B cell, a preselected input signal denoted as TRANIN is applied to the multiplexer and is passed to the control output (CO) terminal when SEL is low.

The operation of the control path 20 is now explained with reference to FIGS. 4A and 4B. Note that, in contrast to the prior art, the wires (lines) carrying the test command and configuration signals from the controller 14 to the generator 12 are replaced by three lines; a data input line 41, a shift line 42, and a select line 43. Signals generated by the controller 14 and the control path sequencer 22 organize the sequence of data input signals and the order in which the data input signals are applied to the control path (shift register) 20 and then propagated along the control path (shift register chain). Selected control outputs (COi) of the control path are applied to selected inputs of the voltages generator 12. By toggling the SHIFT signal, Din signals from the control path sequencer 22 are loaded into the shift register chain and propagated along the chain. During this shifting operation the SEL signal is held low. Consequently all the type-A cells apply their default signal condition to their respective Dapp outputs. For the configuration shown in FIG. 3, the respective default values are applied to the voltages generator 12.

For ease of illustration and explanation FIG. 4A shows a chain of 4 shift register cells connected in cascade while FIG. 4B shows a chain of five cells connected in cascade. These numbers are used for purpose of illustration only. It is expected that the shift register may include a much larger number of stages (see FIG. 7). FIG. 4A shows in block form the interconnection of the controller 14 with the sequencer 22 and the control path 20. FIG. 4B shows the structure and interconnection of five shift register cells in greater detail. Cells C1, C2, C3 and C5 are type-A cells and cell C4 is a type-B cell. Cell C3 is used as a control cell for cell C4. The CO3 output of cell C3 is connected to the SEL input of cell C4. Consequently the default output of C3 (which is assumed to be low) is applied to the SEL input of C4 during the data input shift operation. Thus the TRANIN signal on line 201 is applied to the voltages generator 12. Where the TRANIN signal is a static enable signal, during the shifting operation of the control path, the controller 14 can directly control the static enable signal on line 201 to the voltages generator 12. Similar control signals can be applied to the voltages generator via combinations of cells like C3 and C4. When all the registers of the control path 20 are loaded, the shift-in operation is completed and the SEL signal goes high. The information stored in each register cell is then transmitted to its corresponding CO output. A predetermined set of signals is then applied to the voltages generator 12 to either set it in a certain configuration or to test its operation for a certain configuration or cause it to go through a predetermined sequence or operation.

Note, if cell C3 is storing a low, then cell C4 will continue to pass the TRANIN signal from the controller 14 via line 201 to the voltages generator 12. Thus a static enable signal continues to be applied and to be directly controlled by the controller 14. On the other hand, if cell C3 is storing a high, then cell C4 will pass the signal stored in cell C4 to its corresponding CO4 output. For this condition the static enable signal is controlled by the control path 20.

Using a type-A cell (i.e., C3) to control the SEL input to a type-B cell (i.e., C4), enables the behavior of the multiplexer of C4 to be controlled independently of the global SEL signal. This arrangement eliminates the need to have a separate (additional) select control signal to control the cells of the B-type. Thus, this arrangement avoids the need to run another wire and the space to run the wire.

Figure 7:
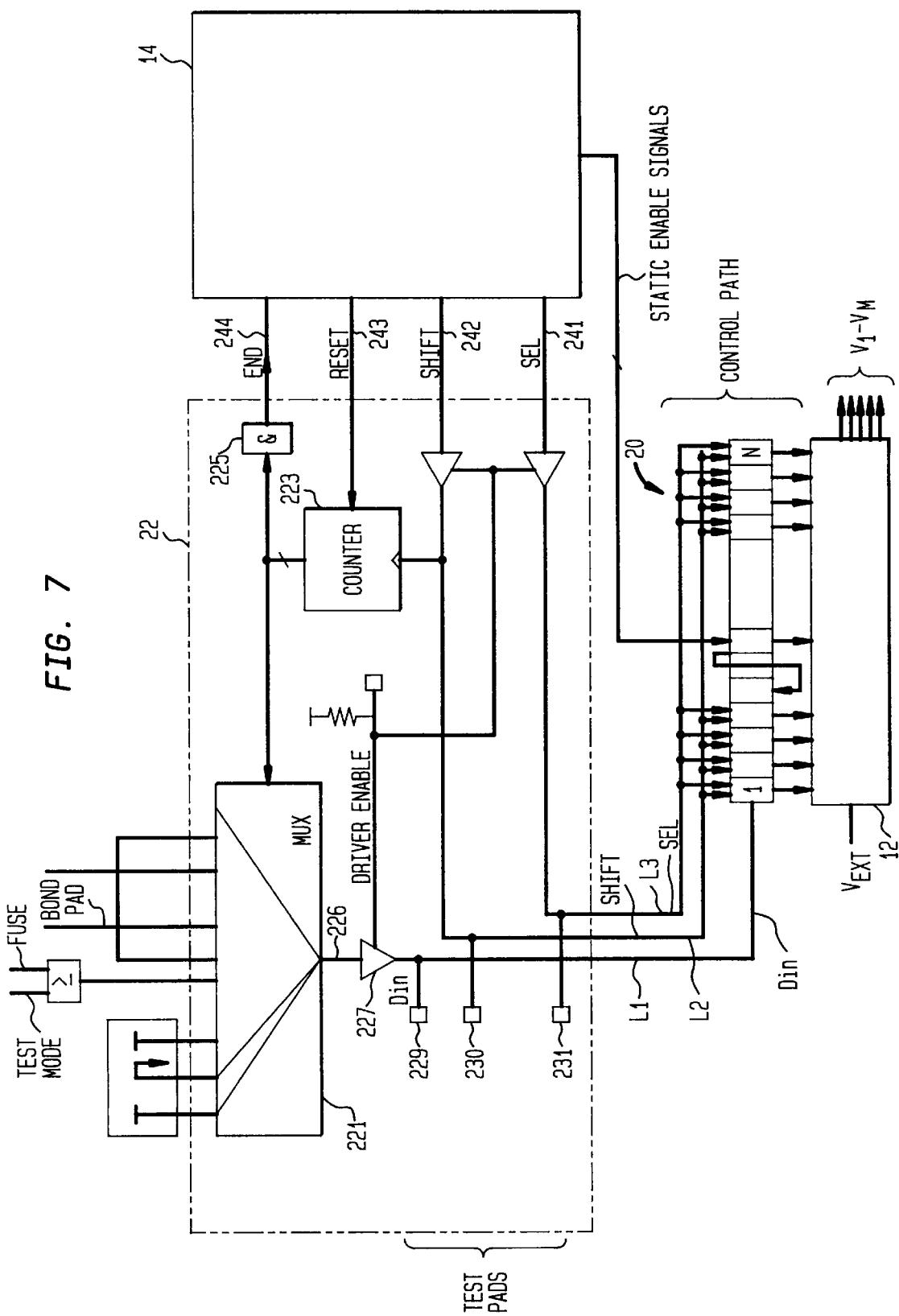
FIG. 7 is a more detailed block diagram of a system embodying the invention.

FIG. 7 presents some details of a control path sequencer 22 suitable for use in practicing the invention. The sequencer circuit 22 includes a multiplexer 221 and a counter 223. In FIG. 7 various test and configuration signals (e.g., test mode, fuse, bond pad) are applied in parallel to the input of a multiplexer 221. Under the control of controller 14, these signals are multiplexed onto an output port 226 which is coupled to an amplifier and gating circuit 227 to produce the control signals which are then applied via line L1 to the input (Din) of the shift register 20. The selection of the signals to be multiplexed may be controlled by controller 14 and/or other circuitry. In FIG. 7, the controller 14 supplies three signals to the sequencer 22; a select signal (SEL), a shift signal (SHIFT), and a reset signal (RESET). The RESET signal is applied to the counter 223 via line 243 to reset it and to initiate a new multiplexing cycle. The shift signal (SHIFT) outputted onto line 242 is supplied to the counter 223, which records each shift signal, and to the control path 20. For each pulse of the SHIFT signal the counter is incremented by one. With each new counter output pattern the multiplexer 221 passes another input bit to its output 226 and via gate 227 onto the Din line L1 which is connected to shift register 20. Since the SHIFT signal controls the propagation of control signals along shift register 20, one by one the registers of the shift register are serially filled with information which was originally applied in parallel to the inputs of multiplexer 221. When the counter 223 reaches its final value (all the selected input signals of the multiplexer have been applied to Din) then a simple logic circuit 225 activates an END signal which is applied to the controller via line 244. Thus, when the counter 223 counts (senses) the occurrence of a sufficient number of shift pulses such that the shift register is filled with new data, it generates a signal supplied to the multiplexer 221 and to a logic circuit 225 which then produces an END signal which is supplied to the controller 14 to indicate that the shift register is full and that a select pulse (SEL) can be generated to cause transfer of data. The select signal (SEL) outputted onto line 241 is transmitted to the output of the sequencer and is applied to the shift register 20. As noted above, the output of multiplexer 221 is applied to a amplifier and gating circuit 227 to shape and produce the data input signals supplied to the input (Din) of the shift register 20. The Din signals on line L1, the SHIFT signal on line L2 and the SEL signal on line L3 can be accessed from test pads 229, 230 and 231, respectively. After and/or concurrent with the production of a select signal, the controller 14 produces a RESET signal on line 243 which is applied to counter 223 to start a new multiplexing cycle and the reloading of the shift register, one stage at a time.

In FIG. 7 the input signals to the multiplexer are shown to be signals obtained from test pads, fuses, bond pads or from a test mode register. However, it should be understood that other control and data signals may be applied to multiplexer 221 for transfer via shift register 20 the voltages generator.

In FIG. 7 the shift register 20 may include N shift register stages; where N is an integer which may vary over a very wide range. However, N should at least be equal to three to provide the benefits anticipated by this invention. Clearly, to fill an N stage shift register, N shift pulses should be applied to completely fill the shift register. As discussed before, only selected control outputs from the cells of the shift register are coupled to the voltages generator. That is, the outputs of the A-cells coupled to the B-cells are not be coupled to the voltages generator.

In FIG. 7 the control path sequencer 22 is shown to be a separate circuit from the controller 14. However, it should be understood that the sequencer 22 may be made part of the controller 14.

In the figures the static enable signals are shown to be applied to the shift register and via the shift register to the voltages generator without going through the sequencer. However, it should be understood that some, if not all, of these signals can also be supplied to the sequencer and fed to shift register via line L1 after undergoing multiplexing.

The invention is particularly useful with a voltages generator. But it should be understood that the invention may be used with any functions generator requiring numerous input control signals to produce a multiplicity of output signals.

What is claimed is:

1. A memory system comprising:
   a functions generator for producing a multiplicity of different output functions for use in the memory system in response to N control signals applied to the functions generator;
   a control path having an input terminal and N output terminals for selectively producing N control signals, in parallel, at said N output terminals;
   means coupling the N output terminals of the control path to the functions generator; and
   data input and control circuitry coupled to the control path for supplying control signals serially to the control path and propagating the control signals along the control path and then selectively applying N control signals, in parallel, to the functions generator.

2. A memory system as claimed in claim 1 wherein said control path is a shift register and wherein said functions generator is a voltages generator.

3. A memory system as claimed in claim 2 wherein said shift register includes a plurality of stages, and wherein each stage includes: (a) a register cell having a data input port, a data output port, and a shift input port for the application thereto of a shift signal for transferring the signal at the data input port to the data output port; and (b) a gating cell having first and second data inputs, a select input and a control signal output, and wherein for one condition of the select input the first data input is coupled to the control signal output and for another condition of the select input the second data input is coupled to the control signal output.

4. A memory system as claimed in claim 3 wherein selected ones of the control signal outputs of the shift register are coupled to the voltages generator.

5. A memory system as claimed in claim 4 wherein a selected control signal output of a shift register stage is coupled to the select input of another stage.

6. A memory system as claimed in claim 3 wherein the first data input of each gating cell of each stage is connected to the control signal output of its stage.

7. A memory system as claimed in claim 6 wherein the second data input of selected gating cells is connected to a predetermined voltage point.

8. A memory system as claimed in claim 7 wherein the second data input of selected gating cells is connected to a control point.

9. A memory system as claimed in claim 2 further including controller and sequencing circuitry for generating a shift signal, a select signal and a data input signal, and wherein the shift signal is coupled via a single shift line to the shift register, wherein the select signal is coupled to the shift register via a single select line, and wherein the data input signal is coupled to the shift register via a single data input line.

10. A memory system as claimed in claim 9 wherein data signals are serially applied to the shift register via said single data input line; and wherein the data signals are propagated along the shift register stages via shift signals applied to the shift register line.

11. A memory system as claimed in claim 10, wherein the data stored in the register cells of the shift register are applied to the voltages generator when the select signal is set to a first condition.

12. A memory system comprising:

a voltages generator for producing a multiplicity of different output voltages for use in the memory system in response to N control signals applied to the voltages generator; and a control path having an input terminal and N output terminals for selectively producing N control signals, in parallel, at said N output terminals in response to a stream of input signals serially applied to said input terminal; means coupling the N output terminals of the control path to the voltages generator for supplying said N control signals, in parallel, to said voltages generator; and data input and control circuitry coupled to the control path for supplying control signals serially to the control path and propagating the control signals along the control path and then selectively applying N control signals, in parallel, to the voltages generator.

13. A memory system as claimed in claim 12 wherein said control path is a shift register comprised of a plurality of stages, and wherein each stage includes: (a) a register cell having a data input port, a data output port, and a shift input port for the application thereto of a shift signal for transferring the signal at the data input port to the data output port; and (b) a gating cell having first and second data inputs, a select input and a control signal output, and wherein for one condition of the select input the first data input is coupled to the control signal output and for another condition of the select input the second data input is coupled to the control signal output.

14. A memory system as claimed in claim 13 wherein selected ones of the control signal outputs of the shift register are coupled to the voltages generator.

15. A memory system as claimed in claim 14 wherein a selected control signal output of a shift register stage is coupled to the select input of another stage.

16. A memory system as claimed in claim 13 wherein the first data input of each gating cell of each stage is connected to the control signal output of its stage.

17. A memory system as claimed in claim 16 wherein the second data input of selected gating cells is connected to a predetermined voltage point.

18. A memory system as claimed in claim 16 wherein the second data input of selected gating cells is connected to a control point.

19. A memory system as claimed in claim 13 further including controller and sequencing circuitry for generating a shift signal, a select signal and a data input signal, and wherein the shift signal is coupled via a single shift line to the shift register, wherein the select signal is coupled to the shift register via a single select line, and wherein the data input signal is coupled to the shift register via a single data input line.

20. A memory system as claimed in claim 19 wherein data signals are serially applied to the shift register via said single data input line; and wherein the data signals are propagated along the shift register stages via shift signals applied to the shift register line.

21. A memory system as claimed in claim 20, wherein the data stored in the register cells of the shift register are applied to the voltages generator Then the select signal is set to a first condition.

* * * * *